US008248111B2

(12) United States Patent
Kitsunezuka

(10) Patent No.: US 8,248,111 B2
(45) Date of Patent: Aug. 21, 2012

(54) VOLTAGE CURRENT CONVERTER, DIFFERENTIATION CIRCUIT, INTEGRATION CIRCUIT, AND FILTER CIRCUIT USING THE CONVERTER, AND VOLTAGE CURRENT CONVERSION METHOD

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 57 days.

(21) Appl. No.: 12/863,741

(22) PCT Filed: Jan. 27, 2009

(86) PCT No.: PCT/JP2009/051243
§ 371 (c)(1),
(2), (4) Date: Jul. 20, 2010

(87) PCT Pub. No.: WO2009/096376
PCT Pub. Date: Aug. 6, 2009

(65) Prior Publication Data
US 2010/0289533 A1    Nov. 18, 2010

(30) Foreign Application Priority Data

Jan. 28, 2008  (JP) ................................. 2008-016264
Jul. 8, 2008   (JP) ................................. 2008-177997

(51) Int. Cl.
*H02M 11/00*   (2006.01)
*H03F 3/45*    (2006.01)
(52) U.S. Cl. ...................................... 327/103
(58) Field of Classification Search .................... 327/103
See application file for complete search history.

(56) References Cited

U.S. PATENT DOCUMENTS 7,479,812 B1 * 1/2009 Hariman et al. .............. 327/102

FOREIGN PATENT DOCUMENTS

| JP | 2002176358 A | 6/2002 |
| JP | 2002541709 A | 12/2002 |
| JP | 2003158444 A | 5/2003 |
| JP | 2003317026 A | 11/2003 |
| JP | 2007324659 A | 12/2007 |

OTHER PUBLICATIONS

International Search Report for PCT/JP2009/051243 mailed Apr. 14, 2009.
R. B. Staszewski et al., "All-Digital TX Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.
Un-Ku Moon, "CMOS High-Frequency Switched-Capacitor Filters for Telecommunication Applications", IEEE Journal of Solid-State Circuits, vol. 35. No. 2, Feb. 2000, pp. 212-220.
M. Kitsunezuka et al., "A Widely-Tunable, Reconfigurable CMOS Analog Baseband IC for Software-Defined Radio", Solid-state Circuits Conference 2008, ISSCC 2008, Digest of Technical Papers, Feb. 3, 2008, pp. 66-67, 595.

* cited by examiner

*Primary Examiner* — John Poos
(74) *Attorney, Agent, or Firm* — Michael Dryja

(57) ABSTRACT

It is possible to provide a voltage-current converter which can realize a variable filter having a steep cut-off characteristic with a small area. The voltage-current converter includes: one or more sampling/holding units for sampling an inputted voltage and holding the sampled voltage; one or more separate voltage-current conversion units for outputting a current corresponding to the voltage held by the sampling/holding units; and a control unit for controlling the timing of the sampling and holding of the inputted voltage by the sampling/holding units.

12 Claims, 15 Drawing Sheets

VOLTAGE CURRENT CONVERTER, DIFFERENTIATION CIRCUIT, INTEGRATION CIRCUIT, AND FILTER CIRCUIT USING THE CONVERTER, AND VOLTAGE CURRENT CONVERSION METHOD

This application is the National Phase of PCT/JP2009/051243, filed Jan. 27, 2009, which is based upon and claims the benefit of priority of Japanese Patent Application No. 2008-016264 filed on Jan. 28, 2008 and Japanese Patent Application No. 2008-177997 filed on Jul. 8, 2008, the disclosure of which is incorporated herein in its entirety by reference.

1. Technical Field

The present invention relates to a voltage current conversion technology having finite impulse response filter characteristics in a conversion gain.

2. Background Art

In recent years, everything is becoming equipped with a radio communication function, and a demand for a multi-mode transceiver, which can comply with a plurality of radio communication standards by a single unit, is increased.

A configuration example of a multi-mode receiver is shown in FIG. 1. A low noise amplifier (LNA) amplifies a high-frequency reception signal received by an antenna. A mixer circuit, by performing integration of a local oscillator output having the same frequency as of the high-frequency reception signal and the high-frequency reception signal amplified by the LNA, down converts a high-frequency signal. A variable gain amplifier (VGA) performs adjustment for a signal level. A filter substantially attenuates an interference wave outside a desired signal band. An analog-to-digital converter (ADC) converts an analog signal, which has passed the filter, into a digital signal, and performs various signal processing, such as demodulation, in a digital processing circuit.

A filter accommodated in the multi-mode transceiver is required to have filter characteristics, such as a width or an order of a pass band, according to the communication standard, being variable in a wide range.

Accordingly, a discrete time processing filter, as typified by a switched capacitor filter, is brought to attention as a multi-mode variable filter. Because a bandwidth for the discrete time processing filter is proportional to a sampling frequency, by controlling the sampling frequency, the bandwidth is easily varied in the wide range.

The related art 1, shown in FIG. 2, by sampling an output current of a voltage current converter and integrating it to a capacity, obtains finite impulse response (FIR) filter characteristics or infinite impulse response (IIR) filter characteristics, which is an embodiment of the discrete time processing filter (non-patent document 1).

Furthermore, in the related art 2, shown in FIG. 3, in order to remove the interference wave, adjacent to a desired signal, a higher-level filter is configured, to obtain steep cut-off characteristics (non-patent document 2).

Further, a technique is disclosed, in which when a voltage of an analog voltage source inputted from each of a plurality of channels is converted into a digital value, by switching the channel and by performing sampling consecutively and repeatedly in a sample hold circuit of a successive-approximation type with a sampling condenser, when the voltage of the analog voltage source connected to the specific channel is sampled, at first, the sampling condenser is charged at the analog voltage corresponding to a previous conversion result, in which the voltage of the analog voltage source connected to the specific channel is converted into a digital value, then, said sampling condenser is charged at the voltage of the analog voltage source connected to the aforementioned specific channel, a current, which flows into the A/D converter part from the analog voltage source, is attenuated, thereby a voltage drop in the analog voltage source due to an output impedance is minimized (for example, refer to patent document 1).

Patent document 1: Japanese Patent Laid-Open No. 2002-176358
Non-patent document 1: IEEE JSSC Vol. 39. No. 12, pp. 2278-2291, December, 2004.
Non-patent document 2: IEEE JSSC Vol. 35. No. 2, pp. 212-220, February, 2000.

DISCLOSURE OF THE INVENTION

Problems to be Resolved by the Invention

However, the above-mentioned related art has a problem that when the higher order filter is configured in order to obtain the steep cut-off characteristics, a number of capacitive elements for use increases and an area becomes large.

The present invention therefore has been made to solve the above-mentioned problem, and an object of the present invention is to provide a voltage current converter, which can realize a variable filter having steep cut-off characteristics with a small area, a differentiation circuit, an integration circuit, a filter circuit using the converter, and a voltage current conversion method.

Means for Solving the Problems

In order to achieve the object, the present invention has the following features.

A voltage current converter according to the present invention is a voltage current converter for converting an inputted voltage into a current and outputting it, including: one or more sampling and holding units, each of which has a function of sampling and holding the inputted voltage; one or more individual voltage current converting units, each of which outputs a current corresponding to the voltage, sampled and held by said sampling and holding unit; and a controlling unit, which controls a timing, on which the sampling and holding unit samples and holds the inputted voltage, and is characterized in that a part of or all of the currents outputted from the individual voltage current converting units are added, and the added currents are outputted.

Furthermore, a differentiation circuit according to the present invention is characterized by including one or more of the voltage current converter. Further, an integration circuit according to the present invention is characterized by including one or more of the voltage current converter. Further, a filter circuit according to the present invention is characterized by including one or more of the voltage current converter.

Furthermore, voltage current converting method according to the present invention is characterized by comprising: a step of sampling and holding an inputted voltage; and a step of adding, when outputting a current, which corresponds to the sampled and held voltage, a part of or all of the outputted currents, and outputting the added current, to show finite impulse response filter characteristic or infinite impulse response characteristic for frequency characteristic of a conversion gain.

The Advantageous Effect of the Invention

According to the present invention, a variable filter having steep cut-off characteristics with a small area can be realized.

BEST MODE FOR CARRYING OUT THE INVENTION

Next, preferred embodiments according to the present invention will be described in detail with reference to the drawings.

FIG. 4 is a diagram showing a configuration of a voltage current converter according to a first embodiment of the present invention.

The voltage current converter includes an input terminal 11, an output terminal 12, N individual voltage current conversion units 131 to 13N, wherein N is an integer being two or more (conversion gains are Gm01 to Gm0N, respectively), N switching devices 141 to 14N connected in series between a voltage current conversion input terminal 11 and respective input terminals of the individual voltage current conversion units, N capacities 151 to 15N connected between individual voltage current conversion units 131 to 13N input terminals and fixed electric potential, and a control unit 16 controlling switching of the switching devices 141 to 14N. Output terminals of the individual voltage current conversion units 131 to 13N are all connected to the voltage current conversion output terminal 12. The switching devices 141 to 14N or the capacities 151 to 15N are an example of a sampling holding unit.

Each of the switching devices 141 to 14N will be in a closed (on) state when a control clock signal represents 1, and in an open (off) state for 0.

The control unit 16 generates control clock signals having N phases of CLKB1 to CLKBN, as shown in FIG. 5, and controls switching for the switching devices 141 to 14N, respectively. Each of CLKB1 to CLKBN does not take 1 simultaneously, and is a clock signal, wherein a rising and falling timing is off. As a method of obtaining CLKB1 to CLKBN, there are a method of generating inside, and a method of selecting from a plurality of clock signals supplied from outside.

An operation of the voltage current converter will be described below. First, when CLKB1 takes 1, the switching device 141 becomes a closed state, and an electric charge proportional to an input voltage Vin is accumulated in the capacity 151. Even after CLKB1 becomes off, because the electric charge at the moment when the switching device 141 turns to the open state is held in the capacity 151, the voltage of the input device of the individual voltage current conversion unit 131 remains constant at Vin. Therefore, until CLKB1 next takes 1, the current, outputted from the individual voltage current conversion unit, remains constant at Gm01*Vin/N. The individual voltage current conversion units 132 to 13N, the switching devices 142 to 14N, and the capacities 152 to 15N perform the similar operation as above at different timings, respectively.

Accordingly, the voltage current conversion unit performs one sampling within a sampling cycle, Tsample=1/(N*fCLK). For example, when CLKB1 is 1, the individual voltage current conversion unit 132 holds a voltage corresponding to the input voltage of the time interval, Tsample, before, and the individual voltage current conversion unit 13N holds a voltage corresponding to the input voltage of the time interval, (N-1) Tsample, before. The output currents of the individual voltage current conversion units 131 to 13N are added by connecting all the output terminals respectively, and are outputted from the voltage current converter output terminal 12. Then, a conversion gain GmFIR of the voltage current converter is expressed by the following equation (1).

$$Gm_{FIR} = (1 + z^{-1} + z^{-2} + \ldots + z^{-(N-1)})\frac{Gm_0}{N} \quad \text{[equation 1]}$$

Here, it is z−1=exp(−j2πfTsample), which indicates a delay by one sampling. Further, we assume Gm01=Gm02= . . . Gn0N=Gm0/4. Equation (1) means that frequency characteristics of the conversion gain of the voltage current converter is a moving average filter, which is an embodiment of an FIR filter.

The moving average filter frequency characteristics, wherein N=4, fCLK=250 MHz, is shown in FIG. 6. An n-th order moving average filter has (N−1) zero-points in the region where the bandwidth is less than or equal to N*fCLK, and a zero-point frequency is expressed by k*fCLK (k is an arbitrary integer). In addition, a neighborhood of N*fCLK is a pass band. Therefore, with the aid of a simple filter (such as RC filters) to attenuate a noise in the vicinity of N*fCLK, an efficient filtering using a large number of zero-points is performed. In addition, although the conversion gains of the individual voltage current conversion units 131 to 13N are set to Gm0/N here, they are not necessary to be the same value. Furthermore, they may be positive values or negative values.

An example of the circuit, when N=4, in FIG. 4 is shown in FIG. 7. The individual voltage current conversion units 131 to 134 can be realized by a CMOS inverter, and the switching devices 141 to 144 can be realized by a CMOS transmission gate. Further, because the capacities 151 to 154 can be substituted by capacities parasitizing the individual voltage current conversion units and the switching devices, it is not necessary to add a capacitive element explicitly. As a result, the voltage current converter consists only of active elements, and it becomes a small area, compared to the FIR filter using the switched capacitor.

It is desirable that an ON time in CLKB1 to CLKBN is about 7 times of a time constant determined by an ON resistance of the switching devices 141 to 14N and a capacity value of the capacities 151 to 15N. If shorter than this, charging the capacities 151 to 15N is insufficient, and a waveform degrades. On the other hand, if longer than this, a ratio of a continuous time signal included in an output current waveform increases, and sufficient attenuation characteristic at the zero-point is not obtained. Further, when the input signal is a discrete time signal sampled in advance, it may be equal to or greater than 7 times of the time constant.

When, as a CMOS process, the 90 nm CMOS process is used, CLKB1 to CLKBN having the ON time of about several 100 ps and a frequency of about several 100 MHz can be generated with a low power consumption compared to the filter circuit. The ON resistance and the capacity value are sufficient of about several 100 Ohm and of several 100 fF respectively, and it can be easily configured with a simple CMOS inverter or a transmission gate.

On the other hand, in order to sufficiently attenuate the noise in the vicinity of N*fCLK by a relatively slow RC filter, N*fCLK needs to be a frequency higher than a signal bandwidth by about 100 times.

As can be seen from the above, in the case of the 90 nm CMOS process, it is desirable that the signal bandwidth is equal to or less than several 10 MHz, the fCLK is equal to or less than several 100 MHz, and N is equal to or greater than 3. It is because, for N=2, the advantage of using a periodic zero-point of the FIR filter is small. Generally, it is desirable that fCLK is an integer multiple of the sampling frequency of the latter stage, such as ADC. This is because, by the zero-point, which the FIR filter has, it is possible to sufficiently attenuate a noise folded inside the signal bandwidth on the sampling in ADC. Further, since it becomes possible to generate CLKB1 to CLKBN of higher frequency with the same precision/consumption current, with more refinement in CMOS, the present embodiment can be applied to a signal in a wider bandwidth.

Now, an example of a configuration of the control unit 16 is shown in FIG. 8. A 32-phase clock oscillator, a narrow pulse generator, a pulse decimator, and a matrix switch are provided.

In a voltage current converter according to the present embodiment, each of the sampling holding units samples and holds an input voltage on a different timing, and each of the individual voltage current conversion units outputs a current corresponding to it. The frequency characteristics of the conversion gain of the voltage current converter, by adding one part or all parts of output current of the individual voltage current conversion unit and outputting it, has a FIR filter characteristics. The sampling holding unit, by using a earth capacity of a wiring or a switching device or an input capacity of the individual voltage current conversion unit, can be composed only of an active element. Because the control unit can be composed only of a logic circuit, the area is sufficiently small. Therefore, because the filter circuit using the voltage current converter does not necessarily require a capacity, even if it is made higher-order to obtain steep cut-off characteristics, the area is small. In addition, a bandwidth of the filter is proportional to the sampling frequency, and then can be easily variable by controlling the sampling frequency. According to the above, an effect that a variable filter having a small area and steep cutoff characteristics can be realized is obtained.

[Other Embodiments Of The Present Invention]

FIG. 9 is a diagram showing a configuration of a voltage current converter according to a second embodiment of the present invention. The voltage current converter according to the present embodiment, compared with the first embodiment, has a feature of having individual voltage current conversion units 1311, 1312, 1321, and 1322; and switching devices 1811, 1812, 1821, and 1822 connected in series between output terminals of the individual voltage current conversion units and a terminal 17, respectively. Further, voltage current conversion gains of 1311 and 1321 are Gm0, and voltage current conversion gains of 1312 and 1322 are −Gm0.

Control unit 16, in addition to CLKB1 and CLKB2 of FIG. 5, generates two-phase clock signals CLKC1 and CLKC2, as shown in FIG. 10, and controls switching of the switching devices 1811, 1812, 1821, and 1822. CLKC1 and CLKC2 are clock signals, which do not take 1 simultaneously, and rise on the same timing as CLKB1 and CLKB2, respectively. As a method of obtaining CLKC1 and CLKC2, there are a method of generating inside, and a method of selecting from a plurality of clock signals supplied from the outside.

In the voltage current conversion unit according to the present embodiment, it is controlled so that the output terminal of the individual voltage current conversion unit (1311 or 1321) having the conversion gain Gm0, for an input signal Vin, and the output terminal of the individual voltage current conversion unit (1312 or 1322) having the conversion gain −Gm0, for an input signal one sampling before, z−1 Vin, are connected to the voltage current converter output terminal 12. For example, in FIG. 9, when CLKC1 is 1, an input voltage of the individual voltage conversion units 1311 and 1312 is Vin, and an input voltage of 1321 and 1322 is z−1 Vin. Then, the output terminals of 1311, having the conversion gain of Gm0, and of 1322, having the conversion gain of −Gm0, are connected to the voltage current converter output terminal 12. Therefore, the sum of the output current Gm0Vin from 1311 and the output current −z−1 Gm0Vin from 1322 is an output current of the voltage current converter of the present embodiment. On the other hand, when CLKC2 is 1, the output terminals of the individual voltage current conversion units 1321 and 1312 are connected to the voltage current converter output terminal 12. As a result, the conversion gain GmFIR10 of the voltage current converter according to the present embodiment, as shown in equation (2), is an equation including (1−z−1), which represents a differential in a discrete time signal processing.

$$Gm_{FIR10}=Gm_0(1-z^{-1})$$ [equation 2]

FIG. 11 is a diagram showing a configuration of a voltage current converter according to a third embodiment of the present invention. The voltage current converter of the present embodiment, compared with the first embodiment, has a feature of having individual voltage current conversion units 1311 to 131N, 1321 to 132N, . . . and 13N1 to 13NN; and switching devices 1811 to 181N, 1821 to 182N, . . . and 18N1 to 18NN connected in series between output terminals of the individual voltage current conversion and the terminal 17, respectively. However, conversion gains of 1311, 1321, . . . 13N1 are Gm1, conversion gains of 1312, 1322, . . . 13N2 are Gm2, and the conversion gains of 131N, 132N, . . . 13NN are GmN. Further, in FIG. 11, in order to prevent the figure from being complicated, it is assumed N=4.

The control unit 16, in addition to CLKB1 to CLKBN of FIG. 5, generates N-phase clock signals CLKC1 to CLKCN, as shown in FIG. 12, and controls switching of the switching devices 1811 to 181N, 1821 to 182N, . . . and 18N1 to 18NN. CLKC1 to CLKCN are clock signals, which do not take 1 simultaneously, and rise on the same timing as CLKB1 to CLKBN, respectively. As a method of obtaining CLKC1 to CLKCN, there are a method of generating inside, and a method of selecting from a plurality of clock signals supplied from the outside.

In the voltage current converter according to the present embodiment, it is controlled so that, for an input signal in samplings before, z−mVin (m is an arbitrary integer from 0 to N), the output terminal of the individual voltage current conversion unit having the conversion gain of Gmm+1 is connected to the voltage current converter output terminal 12. For example, in FIG. 11, when CLKC1 is 1, the input voltages of individual voltage converters 1311 to 1314; 1321 to 1324, 1331 to 1334, and 1341 to 1344 are Vin, z−1 Vin, z−2Vin, and z−3Vin, respectively. Then, the output terminals of 1311 having the conversion gain of Gm1, of 1322 having the conversion gain of Gm2, of 1333 having the conversion gain of Gm3, and of 1344 having the conversion gain of Gm4 are connected to the voltage current converter output terminal 12. Therefore, a sum of the output current Gm1 Vin from 1311, the output current z−1Gm2Vin from 1322, the output current z−2Gm3Vin from 1333, and the output current z−3Gm4Vin from 1344 is an output current of the voltage current converter. On the other hand, when CLKC2 is 1, because the output terminals of the individual current converters 1321, 1332, 1343, and 1314 are connected to the voltage current converter output terminal 12, a coefficient of z−m in an output current from each of the individual voltage current conversion unit does not change. As a result, the conversion gain, GmFIR2, of the voltage current converter according to the present embodiment is a transfer function of the general FIR filter expressed by equation (3).

$$Gm_{FIR2}=Gm_1+z^{-1}Gm_2+z^{-2}Gm_3+\ldots+z^{-(N-1)}Gm_N$$ [equation 3]

The voltage current converter according to the present embodiment can arrange a zero-point, besides positions of integer multiple of fCLK, by selecting the coefficient. In addition, signs of the conversion gain Gm1 to GmN of each individual voltage current converter may be positive or negative. It is not necessarily required that all the individual voltage current converters 1311 to 131N, 1321 to 132N, . . . and 13N1 to 13NN always operate. For example, the individual voltage current converter 1311 may operate only during CLK1 is ON. Further, it is not always necessary to juxtapose N times N individual voltage current converters. For example, when focused on the individual voltage current converters 1311 and 1312, as long as Gm1=Gm2, it is possible to have merged into one individual voltage current converter. Furthermore, even when Gm1 is not equal to Gm2, it is possible to configure, by combining an individual voltage current converter having a smaller conversion gain and an individual voltage current converter having a conversion gain of a difference thereof.

FIG. 13 is a diagram showing a configuration of a voltage current converter according to a fourth embodiment of the present invention. The voltage current converter according to the present embodiment has a feature of adding a switching device 191 connected between the voltage current converter (conversion gain GmFIR3) output terminal 17 of the first embodiment and the voltage current converter output terminal 12 of the present embodiment, a switching device 192 connected between the terminal 17 and the fixed potential, and a gain control unit 20 controlling switching of the switching device 191 and the switching device 192. Further, the switching device 191, the switching device 192, and the gain control unit 20 are examples of an electric current extracting unit. Moreover, the third embodiment may be applied instead of the first embodiment.

The gain control unit 20 generates a gain control clock signal CLKA as shown in FIG. 14 and an inversion signal CLKA_INV thereof, which control switching device 191 and switching device 192, respectively. CLKA is a rectangular wave repeating 0 and 1 in a constant cycle, and a switching ratio of the switching device 191 is an ON time ratio of CLKA. In the gain control unit 20, as a method of obtaining CLKA having a desired ON time ratio, there are a method of generating inside, and a method of selecting from a plurality of clock signals supplied from the outside.

A principle of operation of the voltage current converter according to the present embodiment will be described using FIG. 13 and FIG. 14. A voltage Vin inputted to the input terminal 11, according to the same operation as in the first embodiment, is converted to a current GmFIR3*Vin flowing into the terminal 17. When the switching device 191 is in the closed state, the current flowing into the terminal 17 is outputted directly from the output terminal 12, and becomes a voltage current converter output current according to the present embodiment. On the other hand, when switching device 191 turns to the open state, the terminal 17 and the output terminal 12 are separated, and the current flowing into the terminal 17 flows to the fixed potential via the switching device 192. Then, the voltage current converter output current according to the present embodiment becomes 0.

In the above-mentioned operation, the effective voltage current conversion gain, Gmeff, when the converter output current according to the present embodiment is time averaged, is expressed by the following equation (4).

$$Gm_{eff} = \frac{\int_0^{T_{CLKA}} Gm_{FIR3}\, dt}{T_{CLKA}} = \frac{T_{ONA}}{T_{CLKA}} Gm_{FIR3} \quad \text{[equation 4]}$$

Here, in equation (3), TCLKA is a cycle of CLKA, and TONA is an ON time of CLKA. The equation (3) means that the effective conversion gain Gmeff of the voltage current converter of the present embodiment is determined by the ON time ratio (ratio of TONA to TCLKA), i.e. the switching ratio of the switching device 191. Here, the switching ratio is controllable with high accuracy by using a fine CMOS process, moreover, it is variable in a wide range without causing performance deterioration, even under a low voltage. Further, because the switching device 191, the switching device 192, and the gain control unit 20 can be composed of a fine CMOS, there is almost no increase in area. As a result, the conversion gain becomes variable in a wide range without the increase in area even under a low voltage.

The current extracting unit according to the present embodiment performs a sampling process with a frequency, fCLKA=1/TCLKA. Therefore, before sampling in the current extracting unit, it is necessary to attenuate beforehand an interference wave having a frequency equal to or greater than fCLKA. Then, by making fCLKA coincide with the zero-point of the FIR filter, which the voltage current converter has, the interference wave can be removed efficiently. For example, in FIG. 14 it is assumed fCLKA=fCLK.

FIG. 15 is a diagram showing a configuration of a filter circuit of a fifth embodiment according to the present invention. The present embodiment includes the voltage current converters 211 and 212, in FIG. 4, FIG. 9, FIG. 11 or FIG. 13. The transfer function of the filter circuit hereof is expressed by equation (5).

$$F(z) = \frac{Gm_{FIR4}}{Gm_{FIR5}} = \frac{Gm_{41} + z^{-1}Gm_{42} + \ldots + z^{-(N-1)}Gm_{4N}}{Gm_{51} + z^{1}Gm_{52} + \ldots + z^{-(N-1)}Gm_{5N}} \quad \text{[equation 5]}$$

However, GmFIR4 and GmFIR5 in equation (5) are conversion gains of the voltage current converters 211 and 212 respectively, and Gm41 to Gm4N, Gm51 to Gm5N are conversion gains of the individual voltage current conversion units composing voltage current converters 211 and 212. Since equation (5) is a transfer function of a general IIR filter, and a bandwidth of the filter is proportional to the sampling frequency, the bandwidth is variable in quite a wide range. Further, because it is in a small area since a capacity element is not used, the filter order can be raised by increasing the number of the juxtaposed individual voltage current converter, then a filter circuit having steep cut-off characteristics can be configured in a small area.

In particular, the transfer function, when GmFIR5 is configured by the voltage current converter, as shown in FIG. 9, is expressed by equation (6).

$$H(z) = \frac{Gm_{41} + z^{-1}Gm_{42} + \ldots + z^{-(N-1)}Gm_{4N}}{Gm_{51}(1 - z^{-1})} \quad \text{[equation 6]}$$

However, it was made Gm52=−Gm51. Equation (6) shows that the transfer function of the filter circuit includes 1/(1−z−1), which represents an integration in the discrete time signal processing. When the sampling frequency 1/Tsample is sufficiently large compared with a signal frequency f, taking account that (1−z−1) can be approximated as j2πfTsample, the voltage current converter 212 functions effectively as a capacity of Gm51Tsample. As a result, in a filter designed according to a related filter configuration method, by replacing an integrator using a capacity by the present integrator, the present invention can be easily applied.

Further, the voltage current conversion gain with the opposite sign can easily be realized by further inserting a current mirror circuit to the converter output terminal. Or, in the case of the fully differential type, it can be realized by exchanging the input/output connections of the positive phase and the negative phase. Further, plural kinds nay be combined from the voltage current converters of FIG. 4, FIG. 9, FIG. 11, and FIG. 13 and a general voltage current converter with flat frequency characteristics. For example, by using the voltage current converter in FIG. 4 or FIG. 11 on the input side, and using the voltage current converter of FIG. 13 on the output side, and by making the zero-point frequency of the FIR filter on the input side coincide with the sampling frequency at the current extracting unit of FIG. 13, the folding noise in the sampling operation of the current extracting unit can be attenuated.

FIG. 16 is a diagram showing a configuration of a filter circuit according to a sixth embodiment of the present invention. The present embodiment includes voltage current converters 213 and 214, in FIG. 4, FIG. 9, FIG. 11 or FIG. 13, and a capacity 221. The transfer function of the filter circuit hereof is expressed by equation (7).

$$F(s,z) = \frac{Gm_{FIR6}}{sC_1 + Gm_{FIR7}}$$ [equation 7]

$$= \frac{Gm_{61} + z^{-1}Gm_{62} + z^{-2}Gm_{63} + \ldots z^{-(N-1)}Gm_{6N}}{sC_1 + Gm_{71} + z^{-1}Gm_{72} + z^{-2}Gm_{73} + \ldots z^{-(N-1)}Gm_{7N}}$$

However, GmFIR6 and GmFIR7 in equation (7) are the conversion gains of the voltage current converters 213 and 214 respectively, and Gm61 to Gm6N and Gm71 to Gm7N are the conversion gains of the individual voltage current converter, which configures the voltage current converters 213 and 214. C1 shows a capacity value of the capacity 221.

Generally, a frequency characteristics of the FIR/IIR filter represented only by a z function, as shown in FIG. 6, is symmetrical about the Nyquist frequency, which is one-half of the sampling frequency, and in the bandwidth, which is equal to or larger than the sampling frequency, the frequency characteristics, of which is equal to or smaller than the sampling frequency, is repeated. Accordingly, also in the frequency bandwidth equal to or larger than the sampling frequency, a lot of pass bands exist.

The filter circuit according to the present embodiment, by adding a capacity element, and by having the same filter configuration as the general Gm-C filter including a voltage current converter and a capacity, the frequency characteristics of a continuous time filter is superposed onto the transfer function. As a result, an unnecessary pass band can be eliminated. This means that, on sampling at the voltage current converter 214, the noise folded in the pass band can be attenuated.

In particular, the transfer function, wherein GmFIR7 is configured with the voltage current converter, as shown in FIG. 9, is expressed by equation (8).

$$H(s,z) = \frac{Gm_{61} + z^{-1}Gm_{62} + \ldots + z^{-(N-1)}Gm_{6N}}{sC_1 + Gm_{71} + (1-z^{-1})} \approx$$ [equation 8]

-continued
$$\frac{Gm_{61} + z^{-1}Gm_{62} + \ldots + z^{-(N-1)}Gm_{6N}}{s(C_1 + Gm_{71}T_{sample})}$$

However, it is made Gm72=−Gm71. The approximation in equation (8) becomes true, when the sampling frequency 1/Tsample is sufficiently large compared with the signal frequency f. Therefore, the capacity 221 and the voltage current converter 214 effectively function as a capacity of (C1+ Gm51Tsample). In this way, by combining the continuous time like capacity 221 and the discrete time like capacity 214, with restricting an area of the circuit, the folding noise can be attenuated.

However, in the filter circuit according to the present embodiment, the bandwidth of the filter is proportional not only to the sampling frequency but also to Gm/C, a ratio of the conversion gain to the capacity. Therefore, when having the bandwidth variable, it is necessary to control the conversion gain or the capacity value along with the sampling frequency. For example, in case that the sampling frequency is reduced to half in order to reduce the bandwidth to half, the conversion gain is also reduced to half. Then, when the converter in FIG. 13 is used, by changing the ON time ratio of CLKA according to the sampling frequency, the conversion gain can be easily made variable, and there is an advantage that the area does not increase.

The filter circuit is also applicable to the configuration of the general Gm-C filter having the second order or more. Therefore, when configuring a steeper filter, it is possible to have two methods, raising the order of the FIR filter provided in the voltage current converter, and raising the order of the Gm-C filter. In general, when raising the order of the Gm-C filter, because a number of capacities increases, an area increases substantially, but by combining these two methods, a higher-order filter can be configured with a small area.

Furthermore, in the filter circuit according to the present embodiment, it is not always necessary for all the voltage current converters to have FIR filter characteristic. For example, when a converter for continuous time processing, which does not have the FIR filter characteristic, is employed as the converter 213 on the input side of the filter circuit according to the present embodiment and the voltage current converter, as shown in FIG. 4, is employed as the converter 214 on the output side, it is possible to attenuate a noise in the vicinity of N/fCLK by a continuous time processing filter formed by the voltage current converter 213 and the capacity 221, and a filter to be inserted into the former stage becomes unnecessary.

FIG. 17 is a diagram showing a configuration of a filter circuit according to a seventh embodiment of the present invention. The present embodiment includes the voltage current converters 215 to 216, in FIG. 4, FIG. 11 or FIG. 13, a capacity 222, and an operational amplifier 30. The transfer function of the filter circuit is expressed by equation (9).

$$F(s,z) = -\frac{Gm_{FIR8}}{sC_2 + Gm_{FIR9}}$$ [equation 9]

$$= \frac{Gm_{81} + z^{-1}Gm_{82} + z^{-2}Gm_{83} + \ldots + z^{-(N-1)}Gm_{8N}}{sC_1 + Gm_{91} + z^{-1}Gm_{92} + z^{-2}Gm_{93} + \ldots + z^{-(N-1)}Gm_{9N}}$$

However, GmFIR5 and GmFIR6 in equation (9) represent conversion gains of the voltage current converters 215 to 216 respectively, and C2 represents a capacity value of capacity 22 two. In the present embodiment, because the output terminal of the voltage current converter is connected to a virtual ground point of the operational amplifier 30, according to the two reasons described below, it is possible to configure a filter having excellent linearity. The first reason is that an output stage of each of the individual voltage current conversion unit needs not handle a large signal. The second reason is that when the voltage current converter, especially, of the forth embodiment are used, a distortion, arising from a dependence of an ON resistance of a CMOS transmission gate used as a switching device on a voltage between a gate and a source, does not occur. Further, it is not always necessary to use the capacity 222.

FIG. 18 is a diagram showing a configuration according to an eighth embodiment of the present invention. In general, when a Gm-C filter circuit is configured, as shown in FIG. 18 (a), a circuit, in which a capacity 24 is connected between an input terminal 25 and an output terminal 26 of a voltage current converter 23 (conversion gain: Gm10), may be used. By incorporating this circuit into a filter, it becomes possible to configure a filter having an arbitrary transfer function, such as a band pass filter. A transfer function of FIG. 18 (a) is expressed by equation (10).

$$F(s) = 1 + \frac{Gm_{10}}{sC_3} \quad \text{[equation 10]}$$

If the voltage current converters according to the first to the forth embodiments are used as the voltage current converter 23, when the capacity 24 is connected directly to the input terminal 25, a continuous time signal is mixed into a FIR filter of the latter stage via the capacity 24, and a sufficient amount of attenuation cannot be obtained. To perform the FIR filtering also for the signal via the capacity 24, as shown in FIG. 18 (b), the input terminals of the individual voltage current converters 231 to 23N (the conversion gains are Gm101 to Gm10N, respectively, and Gm101+Gm102+ . . . +Gm10N=Gm5N) need only to be connected to the capacities 241 to 24N (the capacity values are C31 to C3N, respectively, and C31+C32+ . . . +C3N=C3), respectively, and the output terminals of the individual voltage current converters 231 to 23N and another terminal of the capacities 241 to 24N need only to be connected to the output terminal 26. The transfer function of FIG. 18 (b) is, then, expressed by equation (11).

$$F(s,z) = \frac{\sum_{k=1}^{k=N} z^{-k+1}(Gm_{10k} + sC_{10k})}{sC_3} \quad \text{[equation 11]}$$

The equation (11) means that the FIR filtering can be performed also for a signal via the capacity 24. Further, in FIG. 12, the case of the voltage current converter according to the first embodiment is shown. In addition, it is not necessary for all the conversion gains of the individual voltage current conversion units 231 to 23N to be the same value, and for the capacity values of the capacities 241 to 24N to be the same value.

Further, each of the embodiments described as above is a preferred embodiment according to the present invention, and variations and modifications can be made without departing from the scope according to the present invention.

Industrial Applicability

The present invention, for example, is applicable to a voltage current converter which converts and outputs an inputted voltage to a current.

Figure 1:
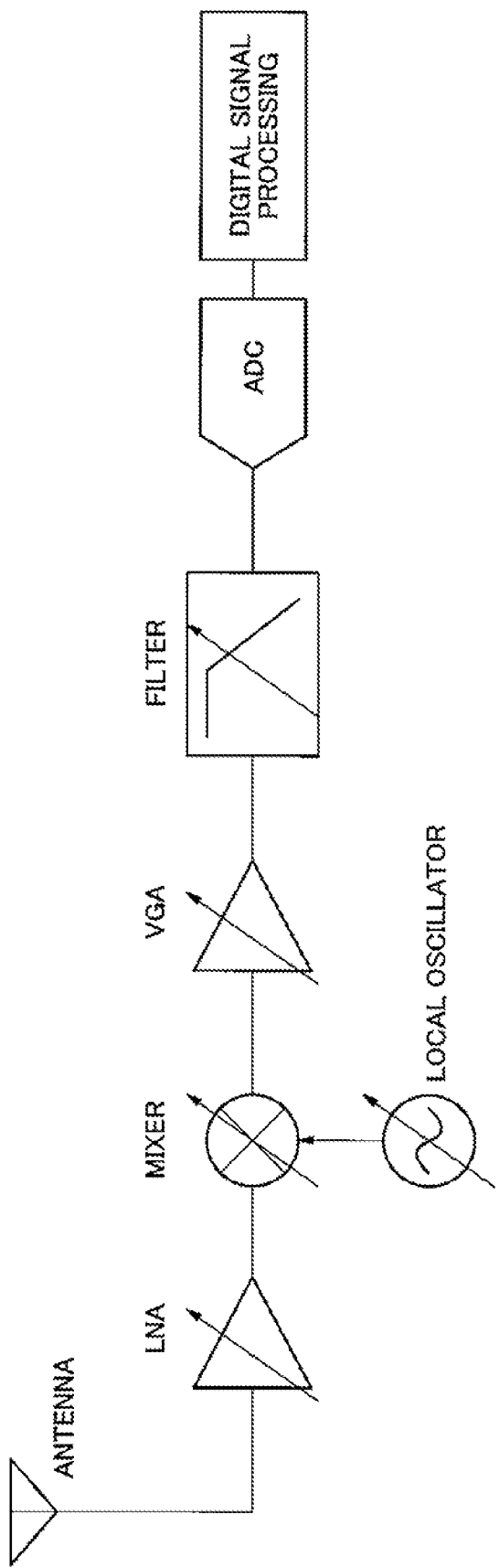
FIG. 1 A figure showing a configuration of a general receiver for multi-mode.
Figure 2:
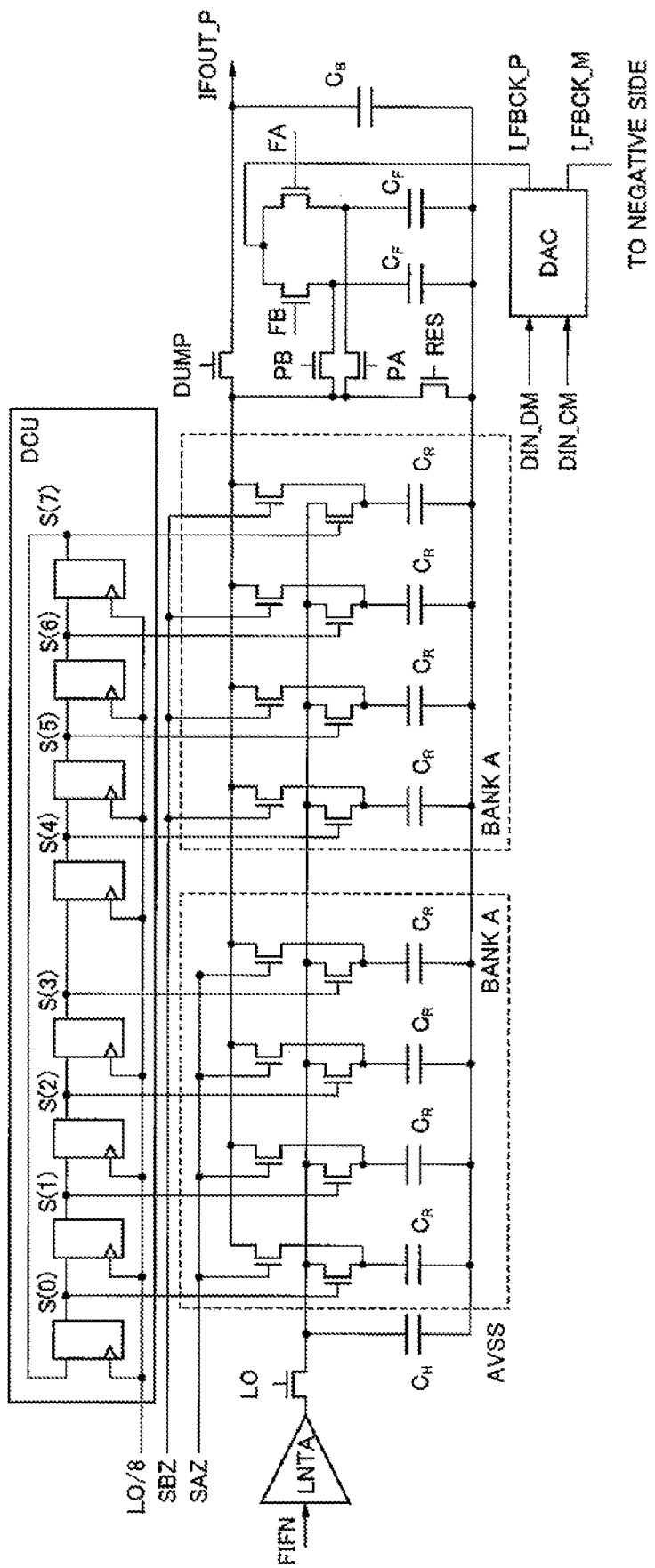
FIG. 2 A circuit diagram showing the related art 1.
Figure 3:
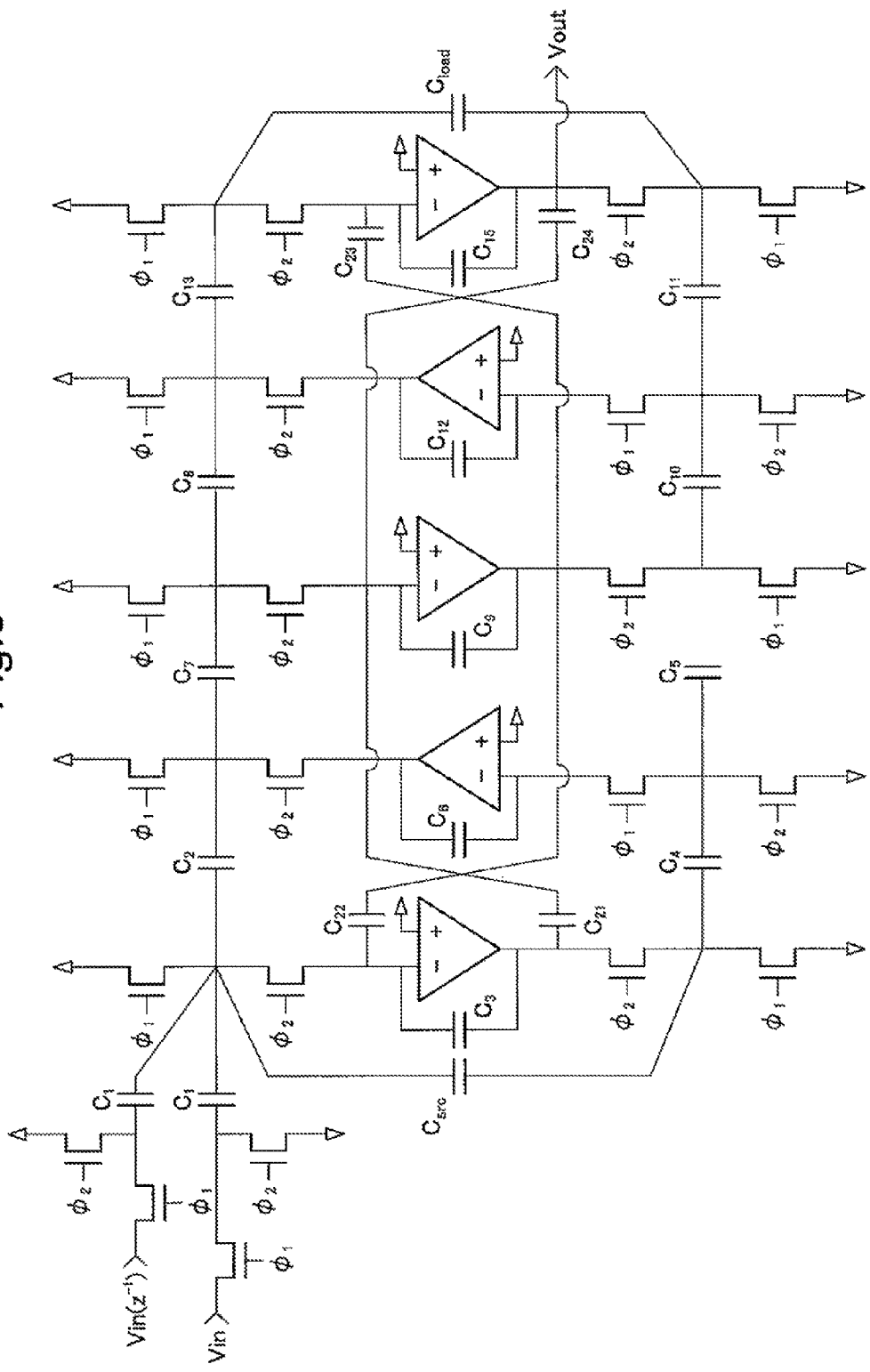
FIG. 3 A circuit diagram showing the related art 2.
Figure 4:
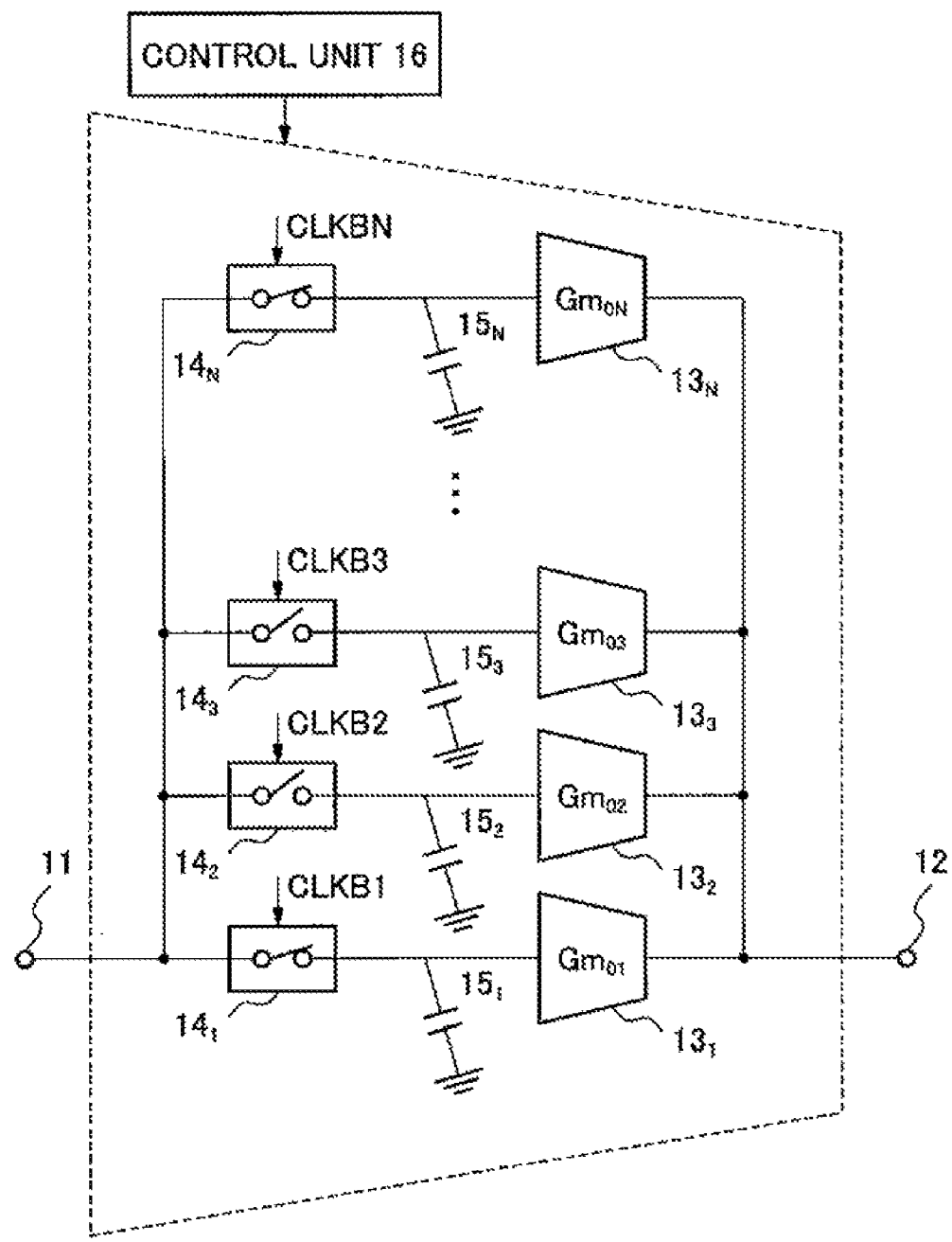
FIG. 4 A circuit diagram showing a first embodiment of the present invention.
Figure 5:
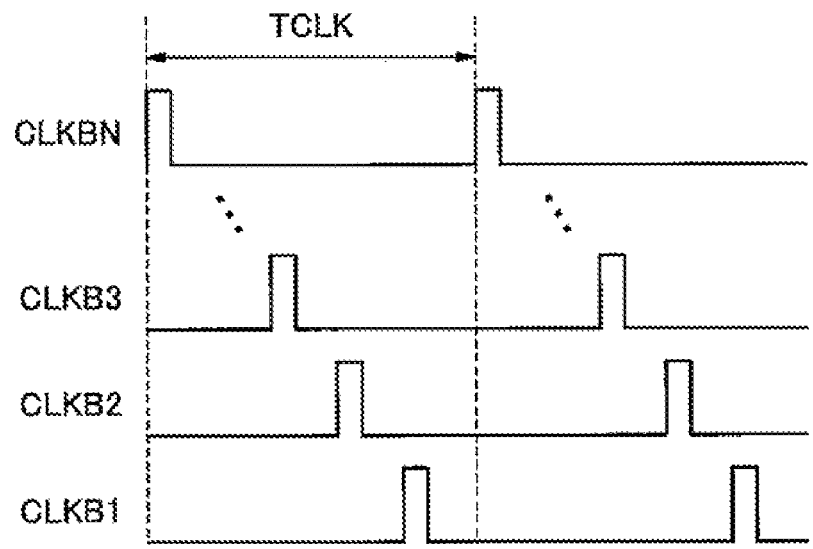
FIG. 5 A diagram showing timing of a clock signal according to the first embodiment of the present invention.
Figure 6:
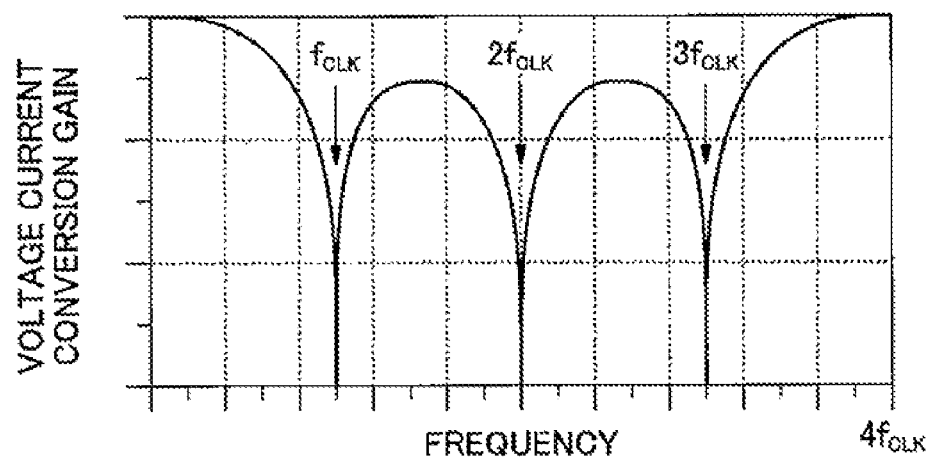
FIG. 6 A diagram showing frequency characteristics according to the first embodiment of the present invention.
Figure 7:
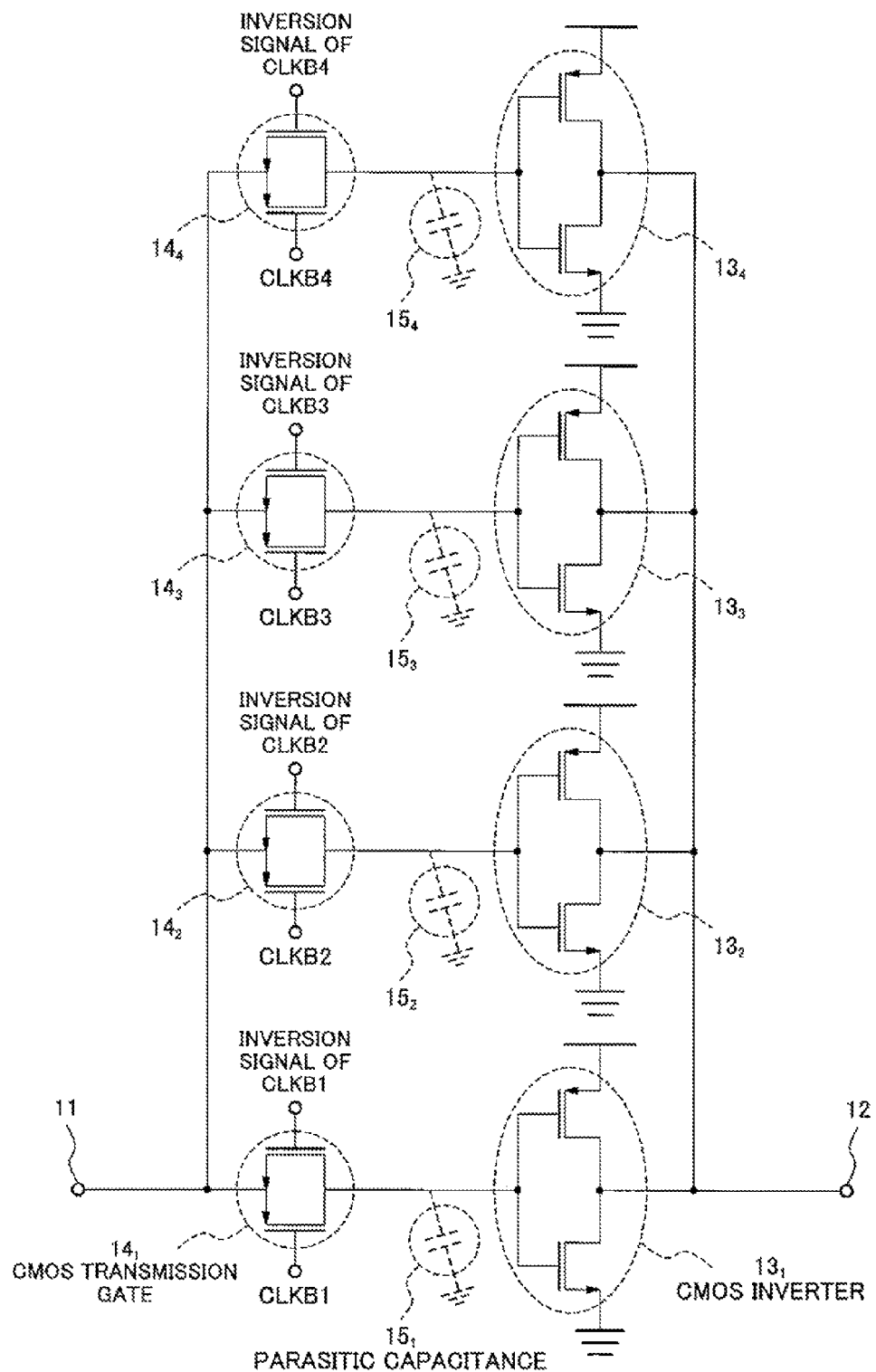
FIG. 7 A circuit diagram showing the first embodiment of the present invention.
Figure 8:
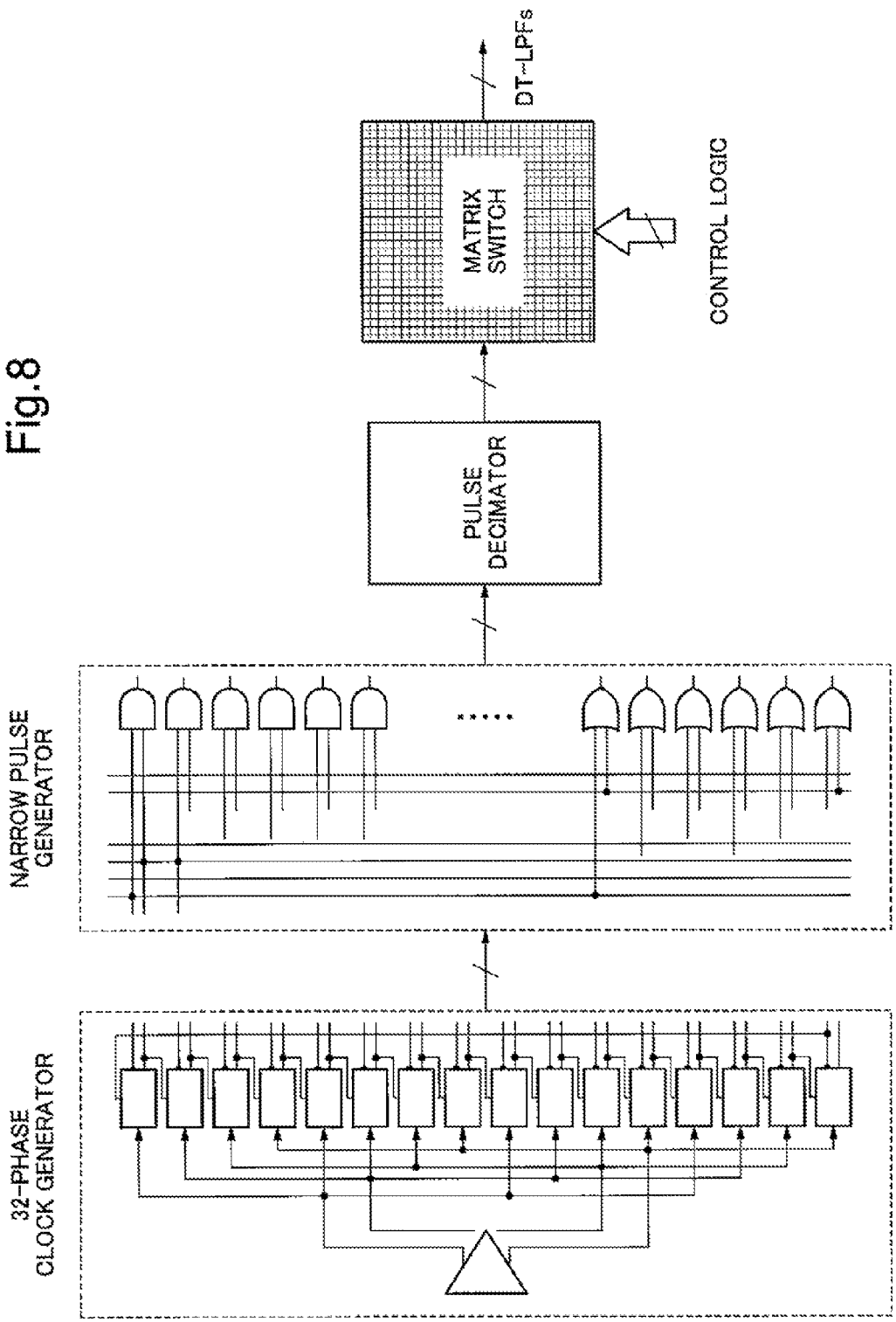
FIG. 8 A diagram showing a control unit according to the first embodiment of the present invention.
Figure 9:
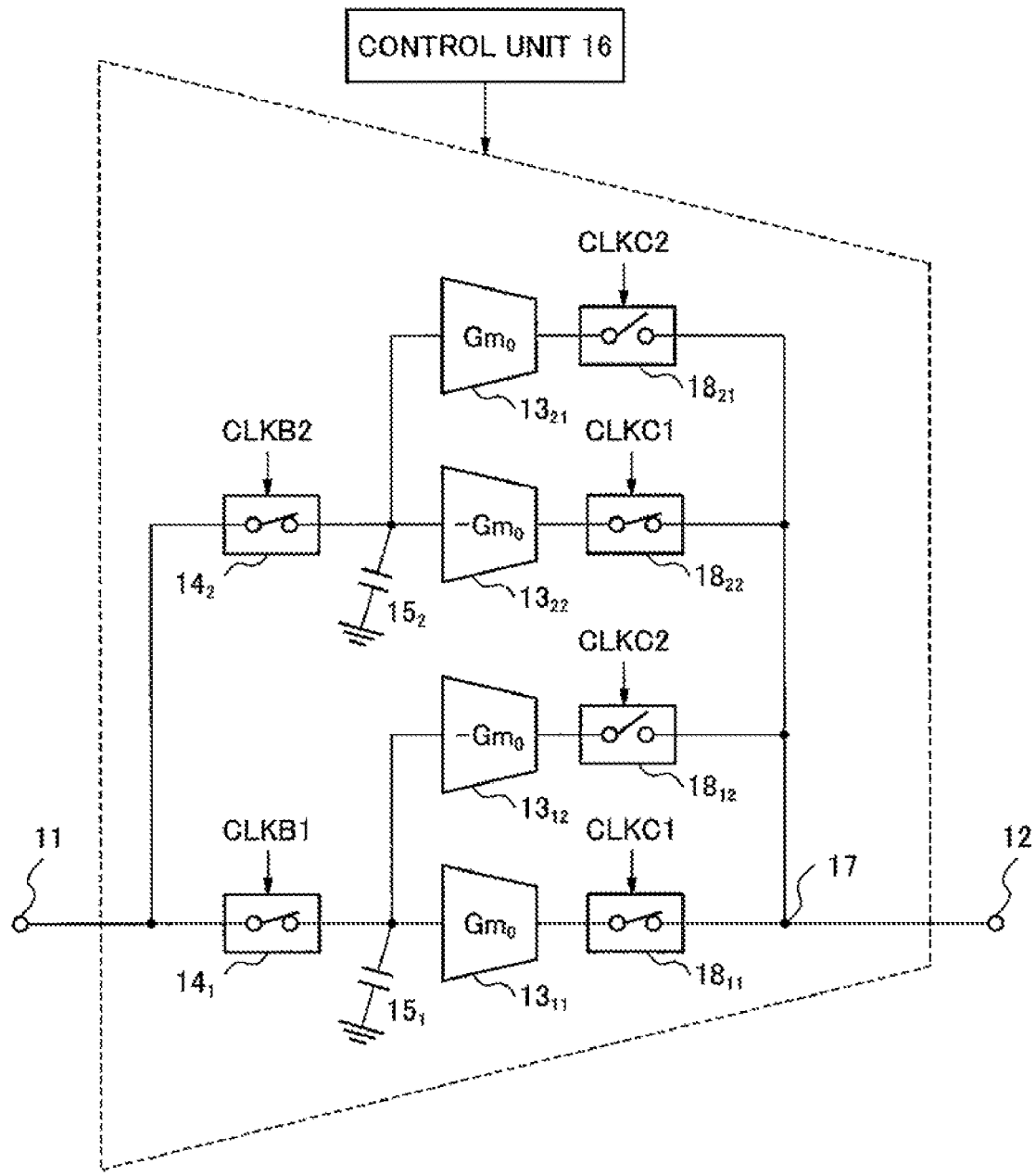
FIG. 9 A circuit diagram showing a second embodiment of the present invention.
Figure 10:
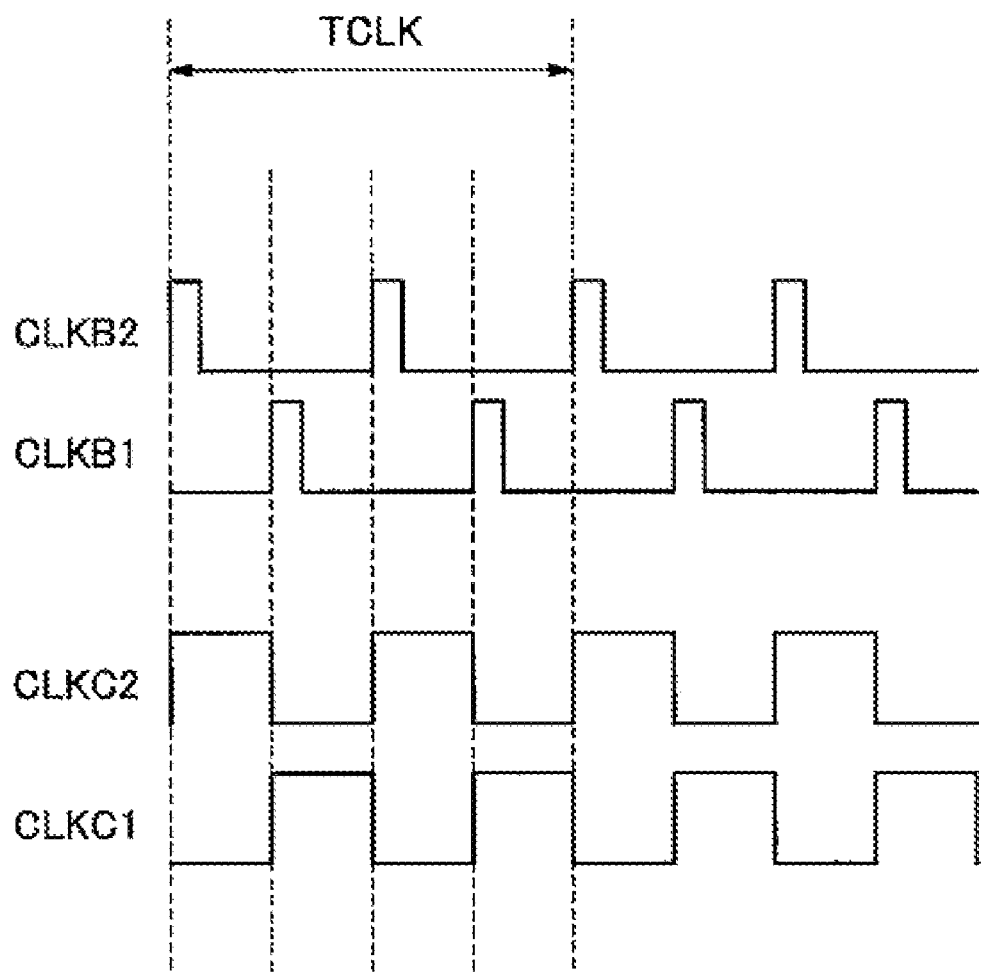
FIG. 10 A diagram showing timing of a clock signal according to the second embodiment of the present invention.
Figure 11:
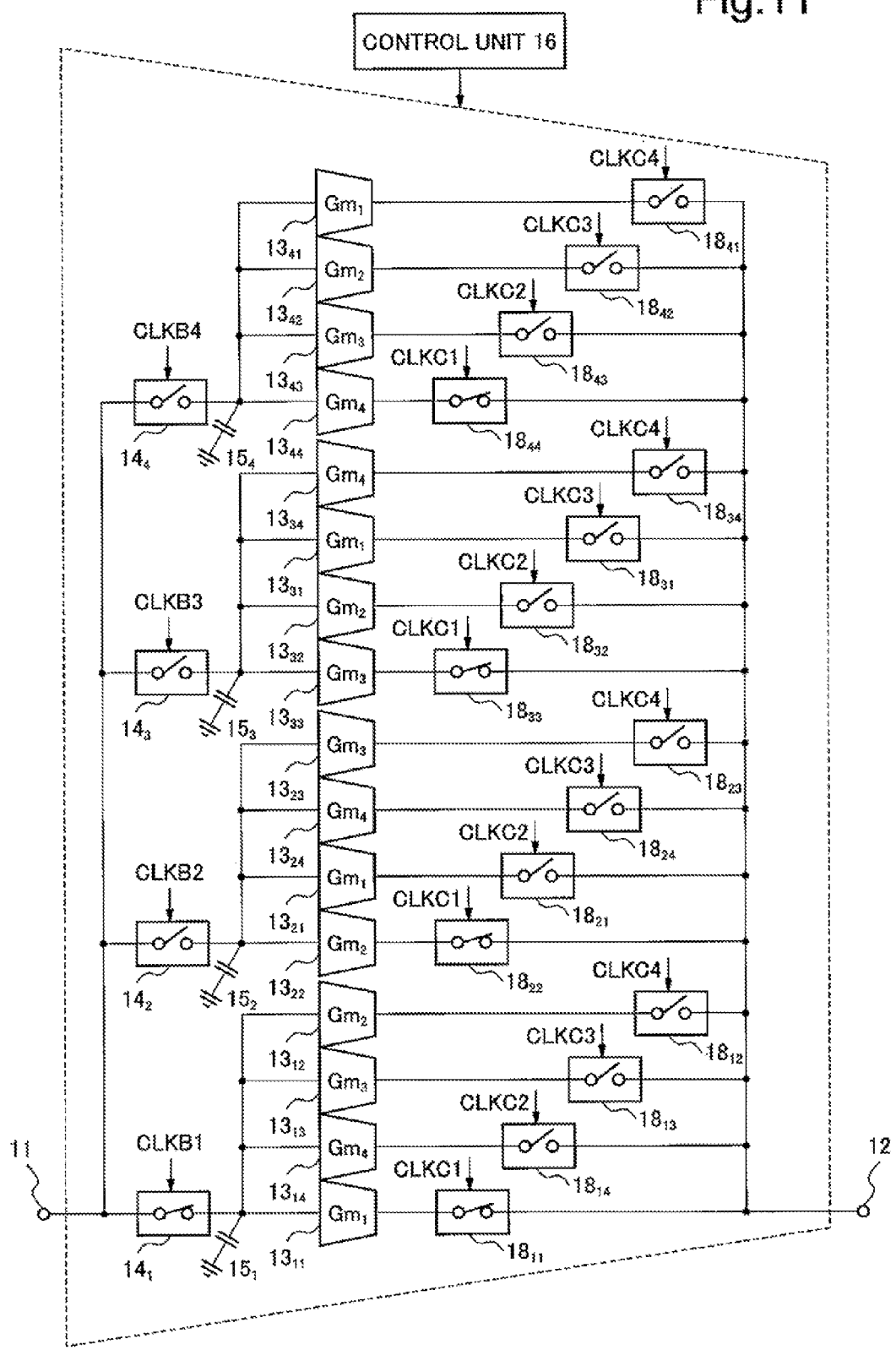
FIG. 11 A circuit diagram showing a third embodiment of the present invention.
Figure 12:
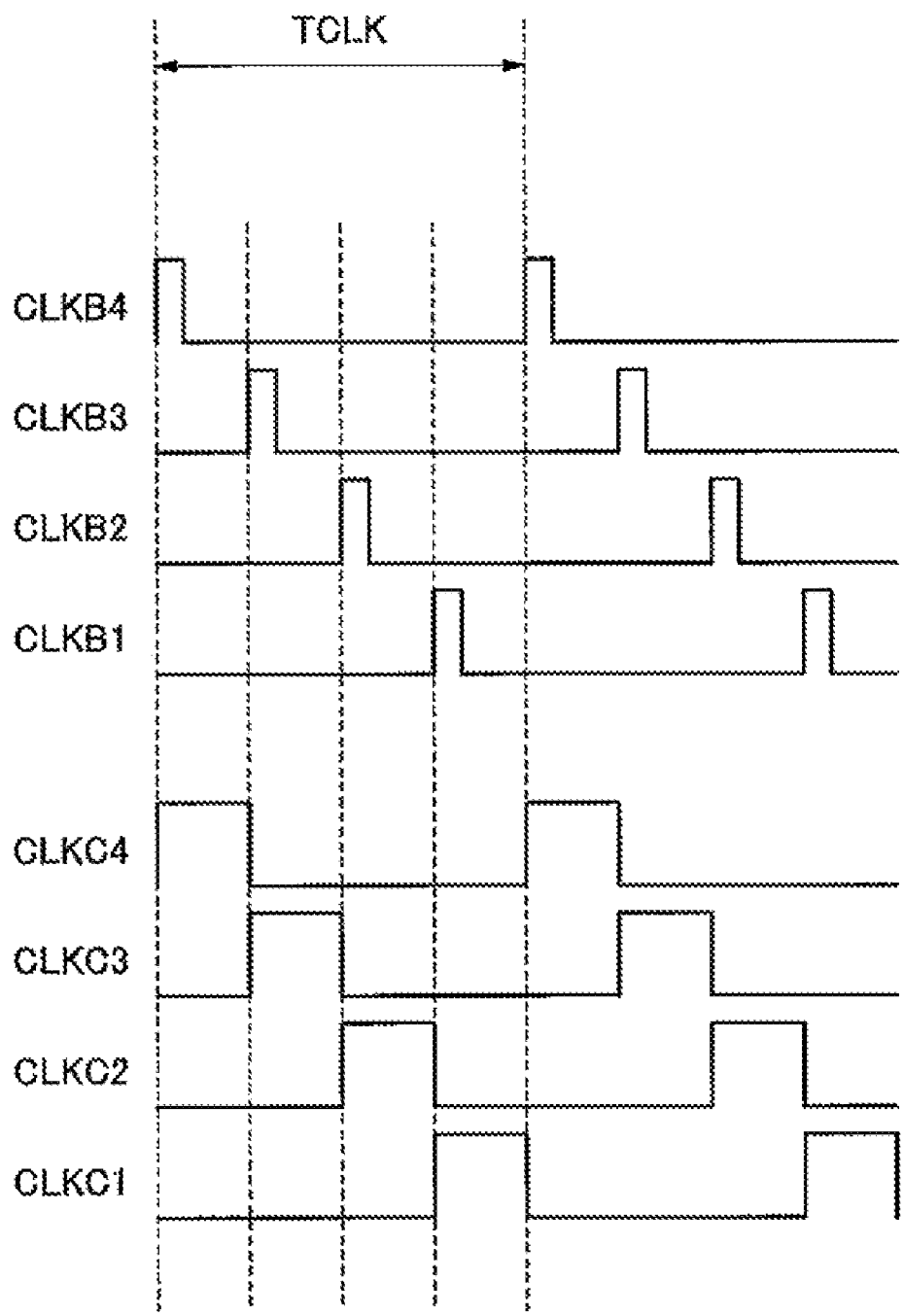
FIG. 12 A diagram showing timing of a clock signal according to the third embodiment of the present invention.
Figure 13:
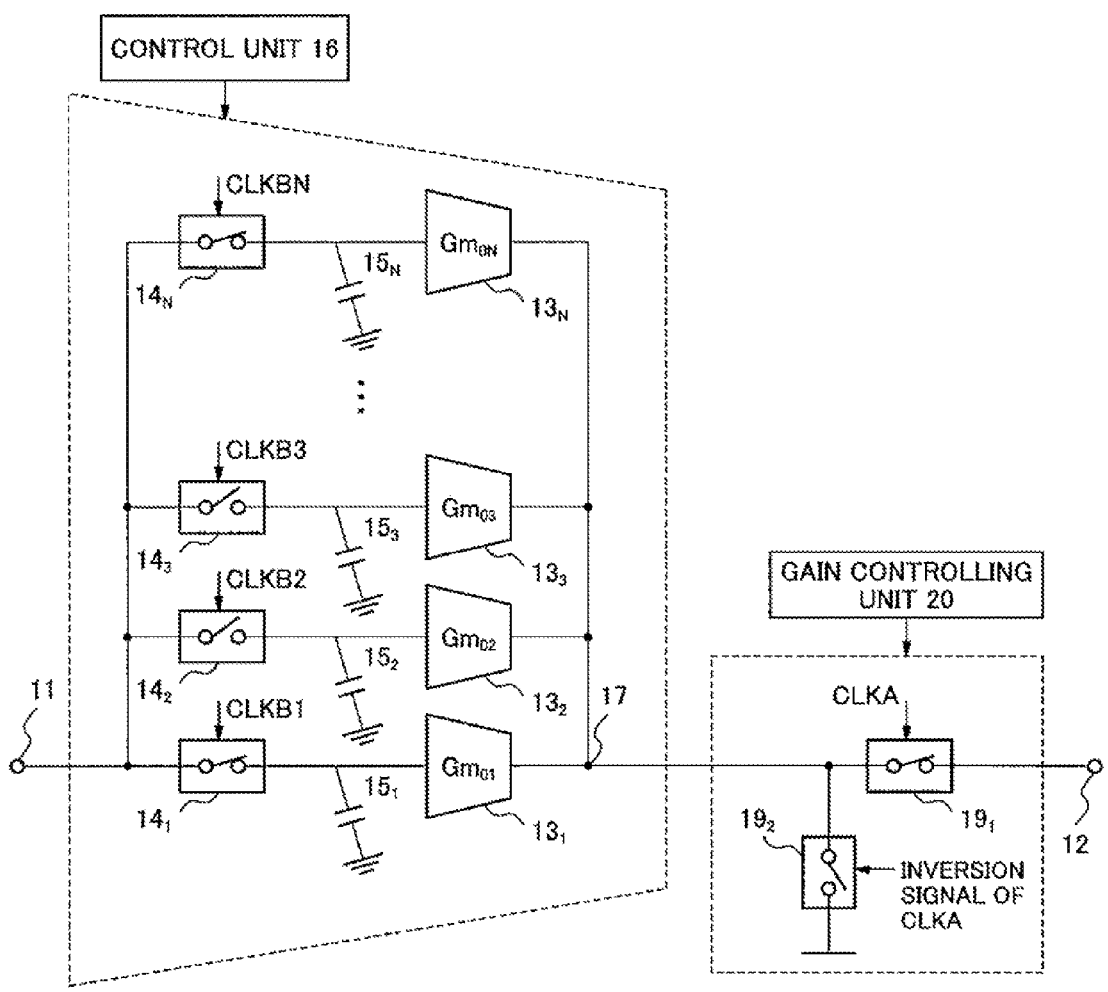
FIG. 13 A circuit diagram showing a fourth embodiment of the present invention.
Figure 14:
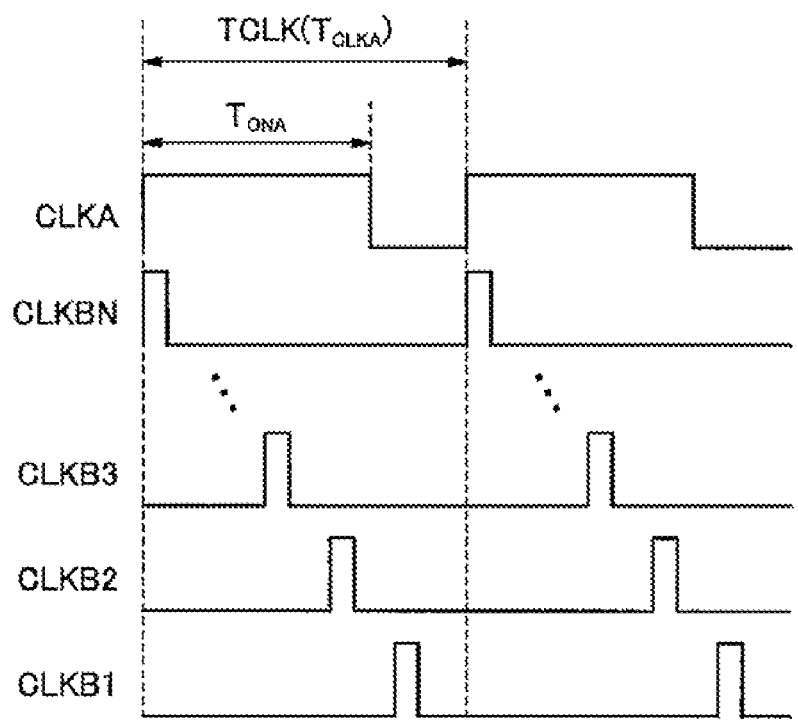
FIG. 14 A diagram showing timing of a clock signal according to the fourth embodiment of the present invention.
Figure 15:
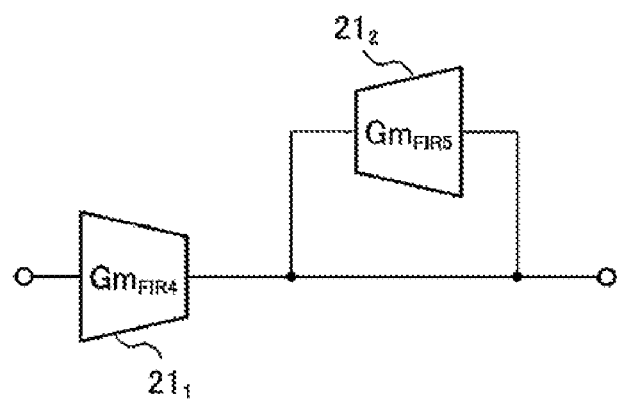
FIG. 15 A circuit diagram showing a fifth embodiment of the present invention.
Figure 16:
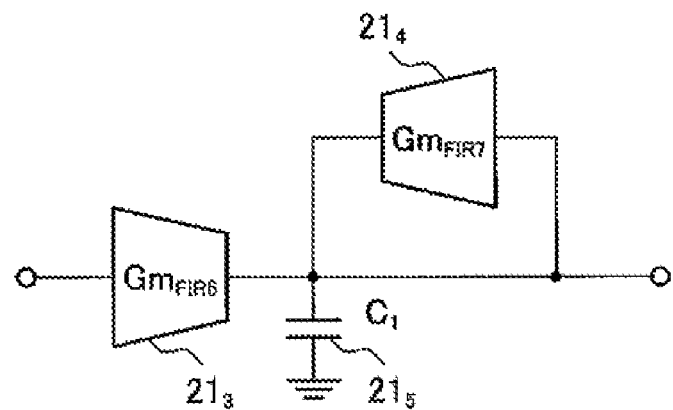
FIG. 16 A circuit diagram showing a sixth embodiment of the present invention.
Figure 17:
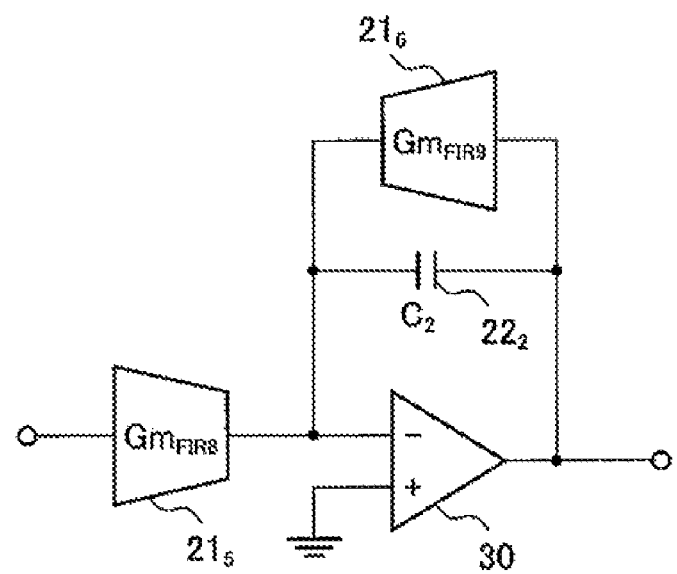
FIG. 17 A circuit diagram showing a seventh embodiment of the present invention.
Figure 18B:
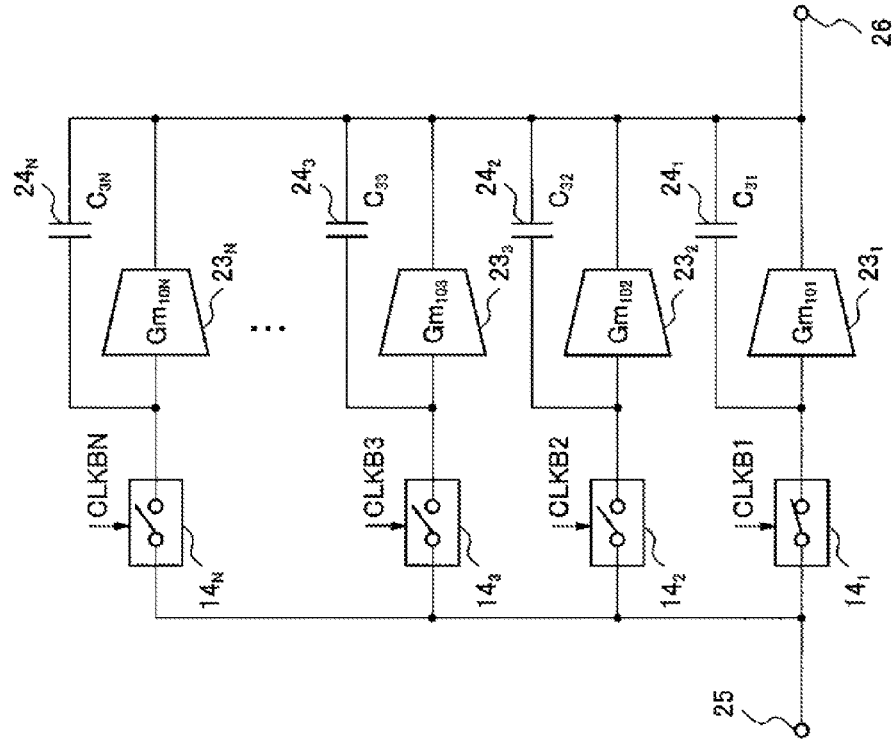
FIG. 18 A circuit diagram showing an eighth embodiment of the present invention.
Figure 18A:
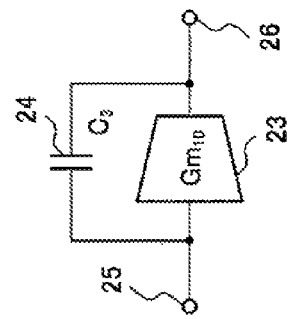

The invention claimed is:

1. A voltage current converter for converting an inputted voltage into a current and outputting said current, comprising:
   a plurality of sampling and holding units configured to sample and to hold the inputted voltage;
   a plurality of individual voltage current converting units configured to output currents, which correspond to the voltage sampled and held by said sampling and holding units, wherein each of the individual current converting units corresponds to one of the sampling and holding units; and
   a control unit configured to control a timing, based on which of the sampling and holding units currently is sampling and holding the inputted voltage, wherein
   when parts of the currents outputted from said individual voltage current converting units are added and said added currents are outputted, frequency characteristic of a gain of conversion, from said inputted voltage into the added and outputted currents, indicates finite impulse response filter characteristic, and
   when all of the currents outputted from said individual voltage current converting units are added and said added currents are outputted, the frequency characteristic of the gain of conversion, from said inputted voltage into the added and outputted currents, indicates infinite impulse response filter characteristic.

2. The voltage current converter according to claim 1, further comprising:
a switching device; and a capacitance, wherein
said capacitance includes at least one of an earth capacity of a wiring, an earth capacity of said switching device, and an input capacity of a latter-stage individual voltage current converting unit.

3. The voltage current converter according to claim 1, comprising:
a plurality of sampling and holding units, each of which samples and holds the inputted voltage at an equal time interval; and
a plurality of individual voltage current converting units, each of which includes an equal conversion gain,
wherein said frequency characteristic indicates moving average filter characteristic.

4. The voltage current converter according to claim 1, further comprising:
a current extracting unit configured to intermittently extract a current from an output terminal of said individual voltage current converting unit and to output the extracted current, wherein
an effective gain of the conversion, from said inputted voltage into the outputted current, is controlled by an intermittent operation ratio of said current extracting unit.

5. A differentiation circuit, comprising the voltage current converter according to claim 1.

6. The differentiation circuit according to claim 5, further comprising:
a capacity element, connected to an output terminal of said voltage current converter.

7. An integration circuit, comprising the voltage current converter according to claim 1.

8. The integration circuit according to claim 7, further comprising:
a capacity element, connected to an output terminal of said voltage current converter.

9. A filter circuit, comprising the voltage current converter according to claim 1.

10. The filter circuit according to claim 9, further comprising:
a capacity element, connected to an output terminal of said voltage current converter.

11. A voltage current conversion method for converting an inputted voltage into a current and outputting said current, comprising:
sampling and holding the inputted voltage, by a plurality of sampling and holding units;
outputting currents, which correspond to the sampled and held voltage, by a plurality of individual voltage current converting units, each individual voltage current converting unit corresponding to one of the sampling and holding units;
controlling a timing, by a control unit, based on which of the sampling and holding units is currently sampling and holding the inputted voltage; and
adding at least parts of the currents outputted from said individual voltage current converting units, and outputting the added currents, wherein
when carts of the currents outputted from said individual voltage current converting units are added and said added currents are outputted, frequency characteristic of a gain of conversion, from said inputted voltage into the added and outputted currents, indicates finite impulse response filter characteristic, and
when all of the currents outputted from said individual voltage current converting units are added and said added currents are outputted, the frequency characteristic of the gain of conversion, from said inputted voltage into the added and outputted currents, indicates infinite impulse response filter characteristic.

12. The voltage current converter according to claim 1, wherein:
at least one of the voltage current converting units includes a different conversion gain as compared to conversion gains of other of the voltage current converting units.

* * * * *